United States Patent
Kim et al.

(10) Patent No.: US 10,387,579 B2
(45) Date of Patent: Aug. 20, 2019

(54) DATA PATTERN DETECTING DEVICE, SEMICONDUCTOR DEVICE INCLUDING THE SAME, AND OPERATING METHOD THEREOF

(71) Applicants: SK hynix Inc., Gyeonggi-do (KR); Industry-University Cooperation Foundation Hanyang University, Seoul (KR)

(72) Inventors: Dong-Wook Kim, Seoul (KR); Soo-Yong Kang, Gyeonggi-do (KR)

(73) Assignees: SK hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 770 days.

(21) Appl. No.: 14/549,190

(22) Filed: Nov. 20, 2014

(65) Prior Publication Data
US 2016/0078051 A1    Mar. 17, 2016

(30) Foreign Application Priority Data

Sep. 12, 2014    (KR) ........................ 10-2014-0120794

(51) Int. Cl.
| | | |
|---|---|---|
| *G06F 17/30* | (2006.01) | |
| *G11C 16/00* | (2006.01) | |
| *G11C 16/16* | (2006.01) | |
| *G11C 16/08* | (2006.01) | |
| *G11C 16/14* | (2006.01) | |
| *G11C 16/04* | (2006.01) | |
| *G11C 16/26* | (2006.01) | |

(52) U.S. Cl.
CPC ........ *G06F 17/30424* (2013.01); *G11C 16/00* (2013.01); *G11C 16/0483* (2013.01); *G11C 16/08* (2013.01); *G11C 16/14* (2013.01); *G11C 16/16* (2013.01); *G11C 16/26* (2013.01)

(58) Field of Classification Search
CPC ..... G11C 16/00; G11C 16/0483; G11C 16/08; G11C 16/10; G11C 16/14; G11C 16/16; G11C 16/26
USPC ........................................................ 711/104
See application file for complete search history.

(56) References Cited

U.S. PATENT DOCUMENTS

| | | | | |
|---|---|---|---|---|
| 5,283,667 | A * | 2/1994 | Kojima .............. | H04N 1/40062 358/1.9 |
| 5,745,245 | A * | 4/1998 | Shibata ................ | H04N 1/4175 358/426.06 |
| 2006/0161822 | A1 * | 7/2006 | Furuta ................. | G06F 11/0775 714/52 |
| 2011/0119455 | A1 | 5/2011 | Tsai et al. | |

(Continued)

OTHER PUBLICATIONS

N. Agrawal, V. Prabhakaran, T. Wobber, J. D. Davis, M. Manasse, and R. Panigrahy. Design tradeoffs for SSD performance. In Proceedings of USENIX Annual Technical Conference, 2008.

(Continued)

*Primary Examiner* — Mardochee Chery
(74) *Attorney, Agent, or Firm* — IP & T Group LLP

(57) ABSTRACT

A pattern detecting device includes a length comparison unit suitable for comparing lengths of compressed input data and compressed reference data; and a data comparison unit suitable for comparing the compressed input data and the compressed reference data.

11 Claims, 9 Drawing Sheets

(56) References Cited

U.S. PATENT DOCUMENTS

2012/0182163 A1* 7/2012 Cho .................. H03M 7/30
 341/87
2015/0186309 A1* 7/2015 Lee .................. G06F 13/385
 710/307

OTHER PUBLICATIONS

Y. Park, and J. S. KIM. zFTL: power-efficient data compression support for NAND flash-based consumer electronics. IEEE Transactions on Consumer Electronics vol. 57, No. 3, 2011.

F. Chen, T. Luo, and X. Zhang. CAFTL: A Content-Aware Flash Translation Layer Enhancing the Lifespan of Flash Memory based Solid State Drives. In Proceedings of USENIX File and Storage Technologies, 2011.

M. Saxena and M. M. Swift. Flashvm: Virtual memory management on flash. In Proc. Usenix Annual Technical Conference, 2010.

C. D Benveniste, P. A. Franaszek, and J. T. Robinson. Cache-memory interfaces in compressed memory systems. IEEE Transactions on computers, vol. 50, No. 11, 2001.

M. Burrows, C. Jerian, B. Lampson, and T. Mann. On-line data compression in a log-structured tile system. In Proceedings of the Architectural Support for Programming Languages and Operating System, Apr. 15, 1992.

G. Milos, D. G. Murray, S. Hand, and M. A. Fetterman. Satori: Enlightened page sharing. In Proceedings of the USENIX Annual Technical Conference. 2009.

R. Koller, R. Rangaswami: I/O deduplication: Utilizing content similarity to improve I/O performance. ACM Transactions on Storage, 2010.

Edison group. HP Thin Technologies: A Competitive Comparison. White paper. 2012.

A. Collette. lzfx—a tiny, extremely fast compression library. https://code.google.com/p/lzfx.

* cited by examiner

| LPA | BPF | INDEX | PPA |
|-----|-----|-------|-----|
| 80  | 0   | 0     | 100 |
| 81  | 0   | 1     | 100 |
| 82  | 0   | 2     | 100 |
| 83  | 1   | 0     | 200 |
| 84  | 1   | 1     | 200 |

DATA PATTERN DETECTING DEVICE, SEMICONDUCTOR DEVICE INCLUDING THE SAME, AND OPERATING METHOD THEREOF

The present application claims priority under 35 U.S.C. § 119(a) to Korean application number 10-2014-0120794, filed on Sep. 12, 2014, in the Korean Intellectual Property Office, which is incorporated herein by reference in its entirety as set forth in full.

BACKGROUND

1. Technical Field

The present invention relates to a data pattern detecting device capable of detecting a specific pattern of data, a semiconductor device including the same, and an operating method thereof.

2. Related Art

A data storage device, such as an SSD (Solid State Drive), which includes a nonvolatile semiconductor memory device such as a NAND flash memory device, substitutes for an existing data storage device such as a hard disk.

Efficient use of data storage space is required in data storage devices such as SSDs. For example, when data of a specific pattern (a "patterned data") is frequently used, only information representing the patterned data is stored instead of storing the patterned data itself. Therefore, the data storage device saves storage space.

The NAND flash memory device may perform read and write operations by units of pages and may perform erase operations in units of blocks. The size of pages is normally 4096 bytes (4 KB), but since the information representing the patterned data is very small, it is possible to save storage space.

Conventionally, an excessive amount of resources is used for detecting patterned data, resulting in degradation of overall data storage device performance. Therefore, a device and a method of detecting patterned data more efficiently are desirable.

SUMMARY

A data pattern detecting device capable of easily detecting patterned data, a semiconductor device including the same, and an operating method thereof are described herein.

In one embodiment of the present invention, a data pattern detecting device may include: a length comparison unit suitable for comparing lengths of compressed input data and compressed reference data; and a data comparison unit suitable for comparing the compressed input data and the compressed reference data.

In another embodiment of the present invention, a semiconductor device may include: a memory cell array; and a control device suitable for controlling the memory cell array for input and output of data requested from a host, wherein the control device comprises: a pattern detecting device suitable for determining whether the data requested from the host has a specific data pattern; an address mapping table suitable for storing a logical address and a physical address corresponding to the logical address for the data of the memory cell array; and a control unit suitable for allocating a specific physical address for the data, which is to be written into the memory cell array in response to a request from the host and has the specific data pattern.

In another embodiment of the present invention, a method for operating a semiconductor device may include: compressing data requested to be written; determining whether the data requested to be written has a specific data pattern; and allocating a specific physical address for the data requested to be written and having the specific data pattern, wherein the determining comprises: comparing lengths of a compressed input data and a compressed reference data; and comparing the compressed input data and the compressed reference data, and wherein the compressed input data is obtained by compressing the data requested to be written, and wherein the compressed reference data is obtained by compressing the specific data pattern.

The present invention provides a data pattern detecting device capable of easily determining whether inputted data has a specific pattern, a semiconductor device including the same, and an operating method thereof. Consequently, as the specific pattern occupies a large space before it is compressed, it is possible to reduce the data storage space that is consumed. Instead of reading data of the specific pattern from a memory cell array and outputting the data, the data of the specific pattern can be directly generated and outputted, so that reading performance can be improved.

BRIEF DESCRIPTION OF THE DRAWINGS

Features, aspects, and embodiments are described in conjunction with the attached drawings, in which:

FIG. 3 is a data structure diagram illustrating an address mapping table shown in FIG. 2;

DETAILED DESCRIPTION

Hereinafter, a data pattern detecting device, a semiconductor device including the same, and an operating method thereof according to the present invention will be described in detail with reference to the accompanying drawings through an exemplary embodiment.

Figure 1:
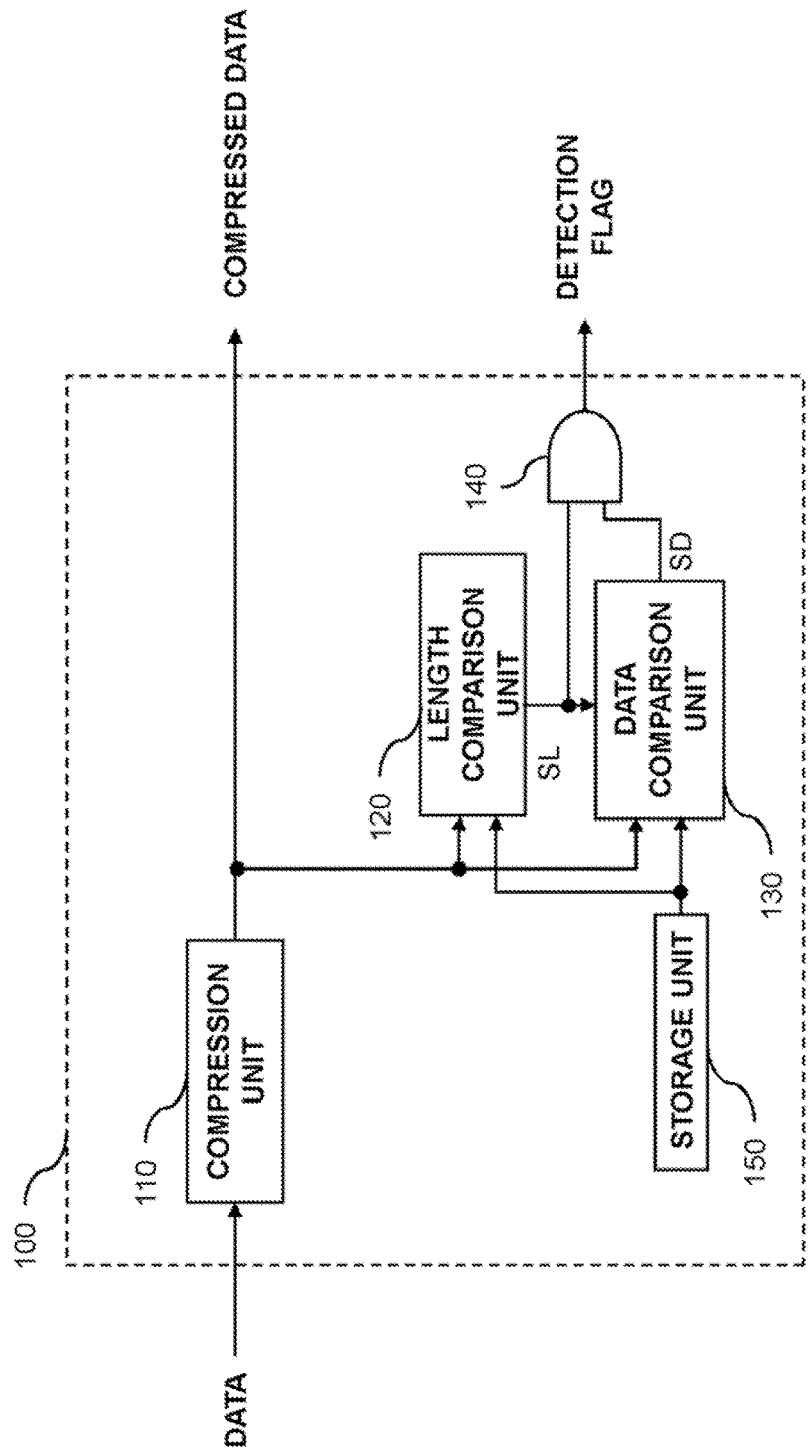
FIG. 1 is a block diagram illustrating a data pattern detecting device according to an embodiment of the present invention.

FIG. 1 is a block diagram Illustrating a data pattern detecting device 100 according to an embodiment of the present invention.

The data pattern detecting device 100 may detect patterned data, and output a detection flag signal.

The data pattern detecting device 100 may include a compression unit 110, a length comparison unit 120, a data comparison unit 130, a flag generation unit 140, and a storage unit 150.

The compression unit 110 may compress inputted data to be stored, and may output compressed data.

The length comparison unit 120 may compare the lengths of the compressed data and compressed reference data stored in the storage unit 150, which is a compressed representation of a specific data pattern. When the lengths of the compressed data and compressed reference data are equal, the length comparison unit 120 enables a length comparison signal SL.

When the length of the compressed data is different from the length of the compressed reference data, the inputted data before the compression is not equal to the specific data pattern, which is represented by the compressed reference data. Accordingly, the data comparison unit 130 may not be activated.

When the length of the compressed data is equal to the length of the compressed reference data, the inputted data before the compression may have a chance to be the same as the specific data pattern, but it is not possible to conclude that the inputted data is the same as the specific data pattern. For example, in the case in which the size of a page is 4 KB and a compression algorithm is the LZF (Lempel-Ziv-Free), when all data in the page is 0 and 1, the lengths after compression are the same as 54 bytes in the two cases.

When the length comparison unit 120 determines that the length of the compressed data is equal to the length of the compressed reference data, the data comparison unit 130 may compare the compressed reference data with the compressed data. When the compressed reference data is equal to the compressed data, the data comparison unit 130 may enable a data comparison signal SD.

The flag generation unit 140 may enable a detection flag when both of the length comparison signal SL and the data comparison signal SD are enabled.

The specific data pattern represented by the compressed reference data may vary according to design, and the following description will be provided for an example of zero data, that is, when the specific data pattern is all "0".

For example, the page size stored in a NAND flash memory device is 4096 bytes (4 KB). It is quite burdensome in view of occupying area and operation time for the data comparison unit 130 to compare each bits of inputted page data and reference page data of 4096 bytes (4 KB) in order to determine whether the inputted page data is the zero page data, thereby degrading the performance of the data pattern detecting device.

However, according to an embodiment of the present invention, the data pattern detecting device 100 may compress the inputted page data thereby reducing the size of the inputted page data. As described above, when compressed by the LZF algorithm, 4096 bytes (4 KB) of the inputted page data may be reduced to 54 bytes.

Consequently, the occupying area and the operation time of the data comparison unit 130 can be considerably reduced. The data comparison unit 130 may be realized using logic gates.

Figure 2:
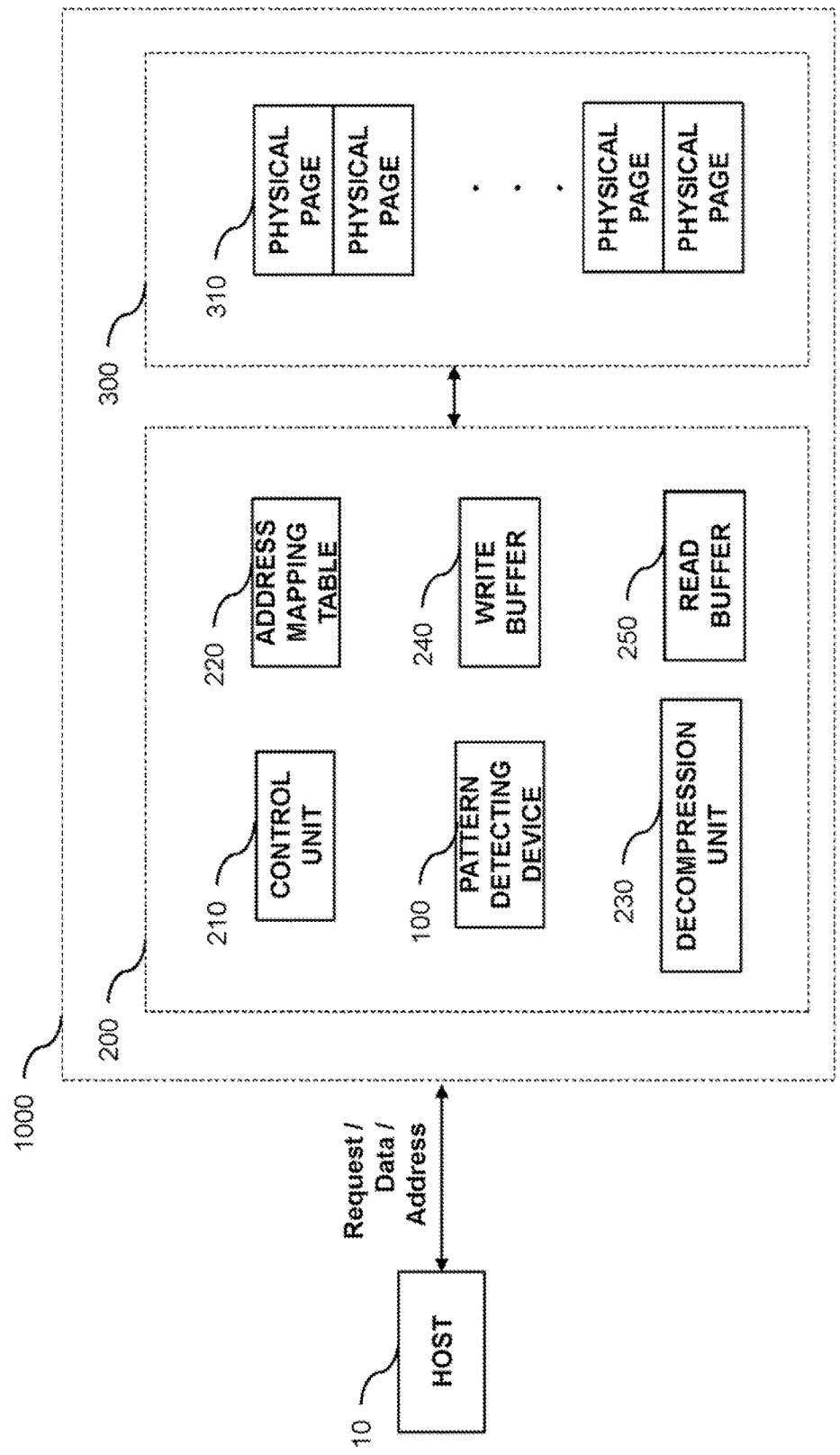
FIG. 2 is a block diagram illustrating a semiconductor device according to an embodiment of the present invention.

FIG. 2 is a block diagram illustrating a semiconductor device 1000 according to an embodiment of the present invention.

The semiconductor device 1000 may perform read and write operations in response to requests from a host 10. The semiconductor device 1000 may be a NAND flash memory device. The host 10 may operate under the control of an operating system therein.

The semiconductor device 1000 may include a memory cell array 300, which is divided in units of physical pages 310, and a control device 200, which controls the memory cell array 300 and inputs/outputs data to/from the memory cell array 300.

The memory cell array 300 may store data in the physical pages 310. The data may be compressed or non-compressed.

The size of the physical page 310 may be different from the size of a logical page. For example, the size of the logical page provided from the host may be 4 KB and the size of the physical page 310 may be 8 KB. In this case, a single physical page may include two non-compressed logical pages.

The control device 200 may include a control unit 210, an address mapping table 220, the pattern detecting device 100, a decompression unit 230, a write buffer 240, and a read buffer 250.

The control unit 210 may generally control various operations of the NAND flash memory device with the FTL (Flash Translation Layer) such as read, write, garbage collection, and ware leveling. Since the general operation of the FTL is well-known, a detailed description thereof will be omitted.

The address mapping table 220 may manage logical addresses requested from the host 10 and physical addresses corresponding to the logical addresses. The relationship between the logical and physical addresses may be updated during the garbage collection, the ware leveling and the like.

The pattern detecting device 100 may include the compression unit 110 that compresses the inputted data as described above. The pattern detecting device 100 may determine whether the Inputted data to be written is the same as the specific data pattern represented by the compressed reference data.

The decompression unit 230 may decompress and output the compressed data from the memory cell array 300 in response to a read request from the host 10.

The write buffer 240 may temporarily store the inputted data in the physical pages 310 of the memory cell array 300.

The read buffer 250 may temporarily store data read from the physical pages 310.

FIG. 3 illustrates a data structure illustrating the address mapping table 220 shown in FIG. 2.

The address mapping table may include a logical address field LPA, a bypass flag field BPF, an index field INDEX, and a physical address field PPA.

The logical address field LPA may store the logical address of data in the memory cell array 300. When the index of the address mapping table 220 can be identified by the logical address transmitted from the host 10, the logical address field LPA may not be separately stored.

The bypass flag field BPF may store 1 when data stored in the physical pages 310 is not compressed, and may store 0 when the data stored in the physical pages 310 is compressed. The compression performance may depend on the type of data, and the size of a compressed data may be greater than the original data, and in this case the data is stored non-compressed.

For example, when original data is compressed and the length of the compressed data is more than 95% of the length of the original data, the original data may be stored non-compressed and the bypass flag and its corresponding logical address is set to 1.

FIG. 3 illustrates that the stored data of the logical addresses 80 to 82 is compressed and the stored data of the logical addresses 83 and 84 is non-compressed.

The physical address field PPA may indicate the addresses of the physical pages 310 corresponding to the logical addresses.

As described above, the sizes of the physical pages 310 may be larger than those of the logical pages. Accordingly, a single physical page 310 may store a plurality of logical pages. Thus, index information may be used in order to identify a plurality of logical pages stored in the single physical page 310. The index field INDEX may store such index information.

For example, in FIG. 3, since the index of the logical address 80 is "0", data of the index "0" may be the first one of the compressed data stored in the physical address 100. Furthermore, since the index of the logical address 84 is "1", data of the index "1" may be the second one of the non-compressed data stored in the physical address 200.

Figure 4:
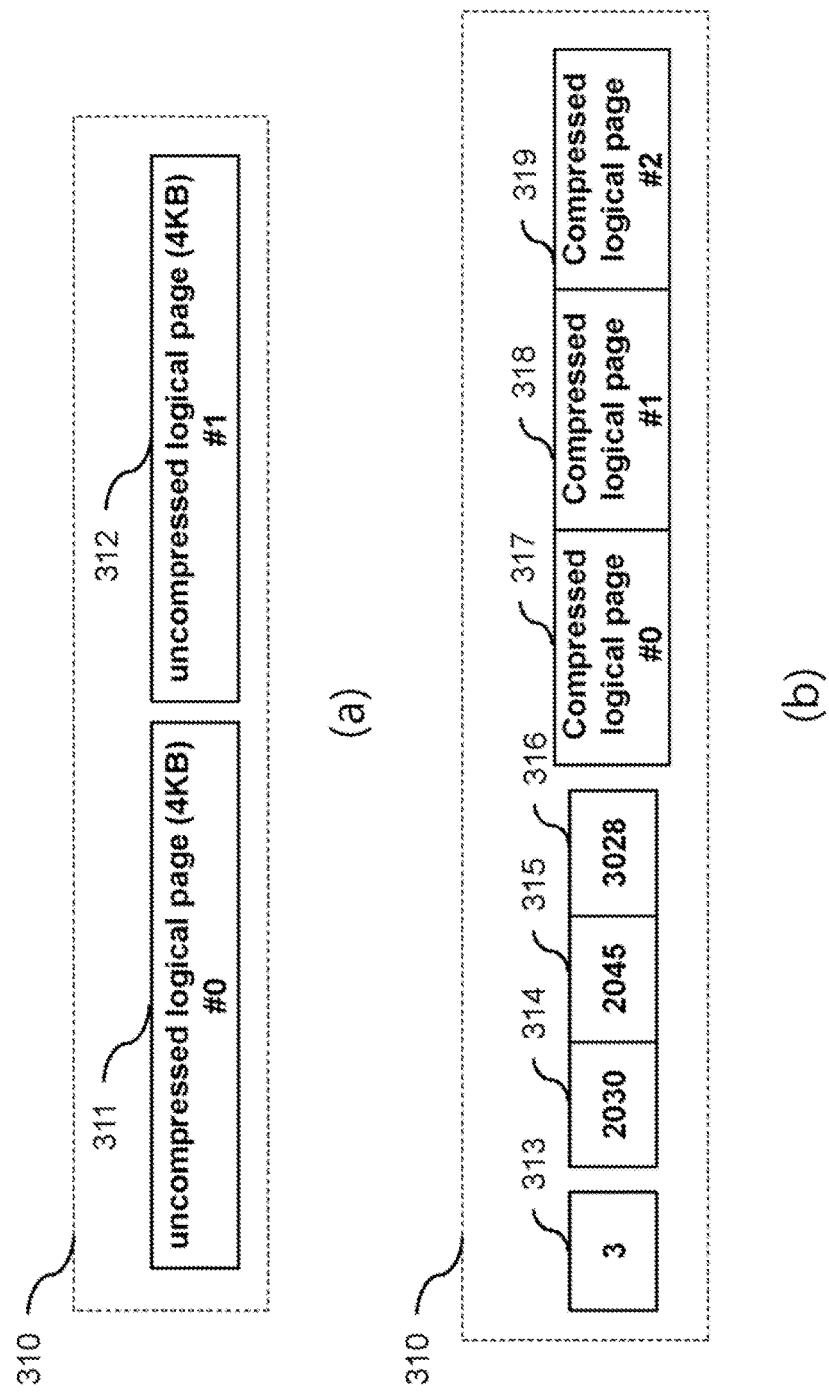
FIG. 4 is a data structure diagram illustrating a physical page shown in FIG. 2.

FIG. 4 illustrates a data structure illustrating the physical page 310 shown in FIG. 2.

(a) and (b) of FIG. 4 illustrate the structures of the uncompressed and compressed logical pages stored in the physical page 310, respectively.

In the present embodiment, since the size of the logical page is 4 KB and the size of the physical page is 8 KB, the single physical page 310 may store two logical addresses 311 and 312 and sequentially correspond to indexes 0 and 1, as shown in (a) of FIG. 4.

In the case of non-compressed data, no further data other than the logical page data may be required.

However, in the case of compressed data, the size of compressed data may be different, and separate meta data for identifying the compressed data may be required.

(b) of FIG. 4 shows three (3) of the compressed logical pages 317 to 319 (page "#0" to "#2"), the lengths 314 to 316 ("2030", "2045", and "3028" bytes) of the compressed logical pages 317 to 319, and the number 313 ("3") of the compressed logical pages 317 to 319 in the physical page 310.

The length data 314 indicates the length of the $0^{th}$ compressed logical page 317, the length data 315 indicates the length of the first compressed logical page 318, and the length data 314 indicates the length of the second compressed logical page 319.

As such, it is possible to identify the compressed logical page data through the physical addresses and the meta data.

Figure 5:
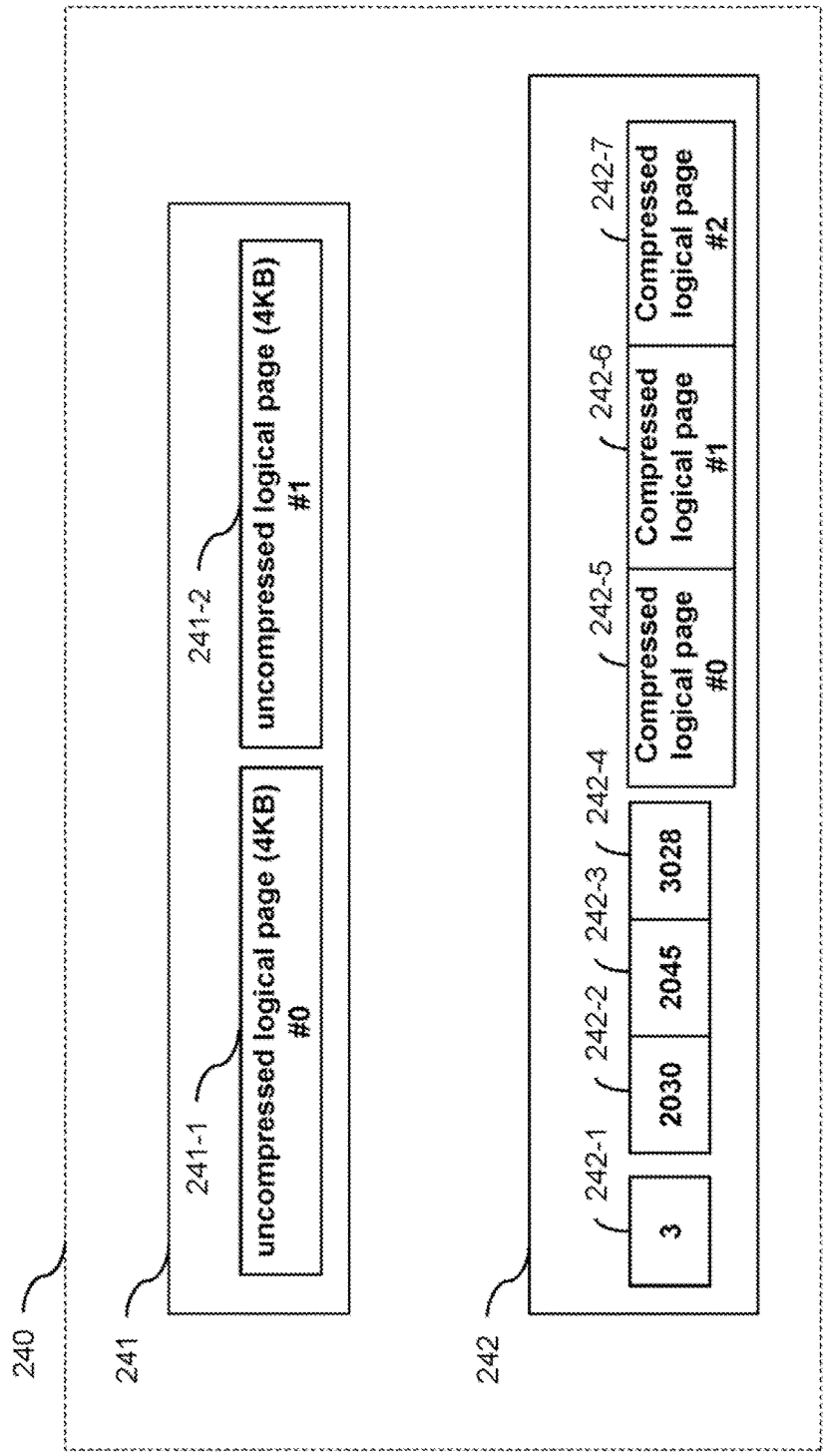
FIG. 5 is a data structure diagram illustrating a write buffer shown in FIG. 2.

FIG. 5 is a block diagram illustrating the write buffer 240 shown in FIG. 2.

The write buffer 240 may include a first write buffer 241 and a second write buffer 242.

The first write buffer 241 may temporarily store the non-compressed logical page, and may have the same structure as the uncompressed logical pages stored in the physical page 310 illustrated in (a) of FIG. 4. The first write buffer 241 may store two non-compressed logical pages 241-1 and 241-2.

The second write buffer 242 may temporarily store the compressed logical page, and may have the same structure as the compressed logical pages stored in the physical page 310 illustrated in (b) of FIG. 4. The second write buffer 242 may store compressed logical pages 242-5 to 242-7 and meta data 242-1 to 242-4 corresponding to the compressed logical pages 242-5 to 242-7. The meta data may include the number 242-1 of the compressed logical pages, and the lengths 242-1 to 242-4 of the compressed logical pages.

Figure 6:
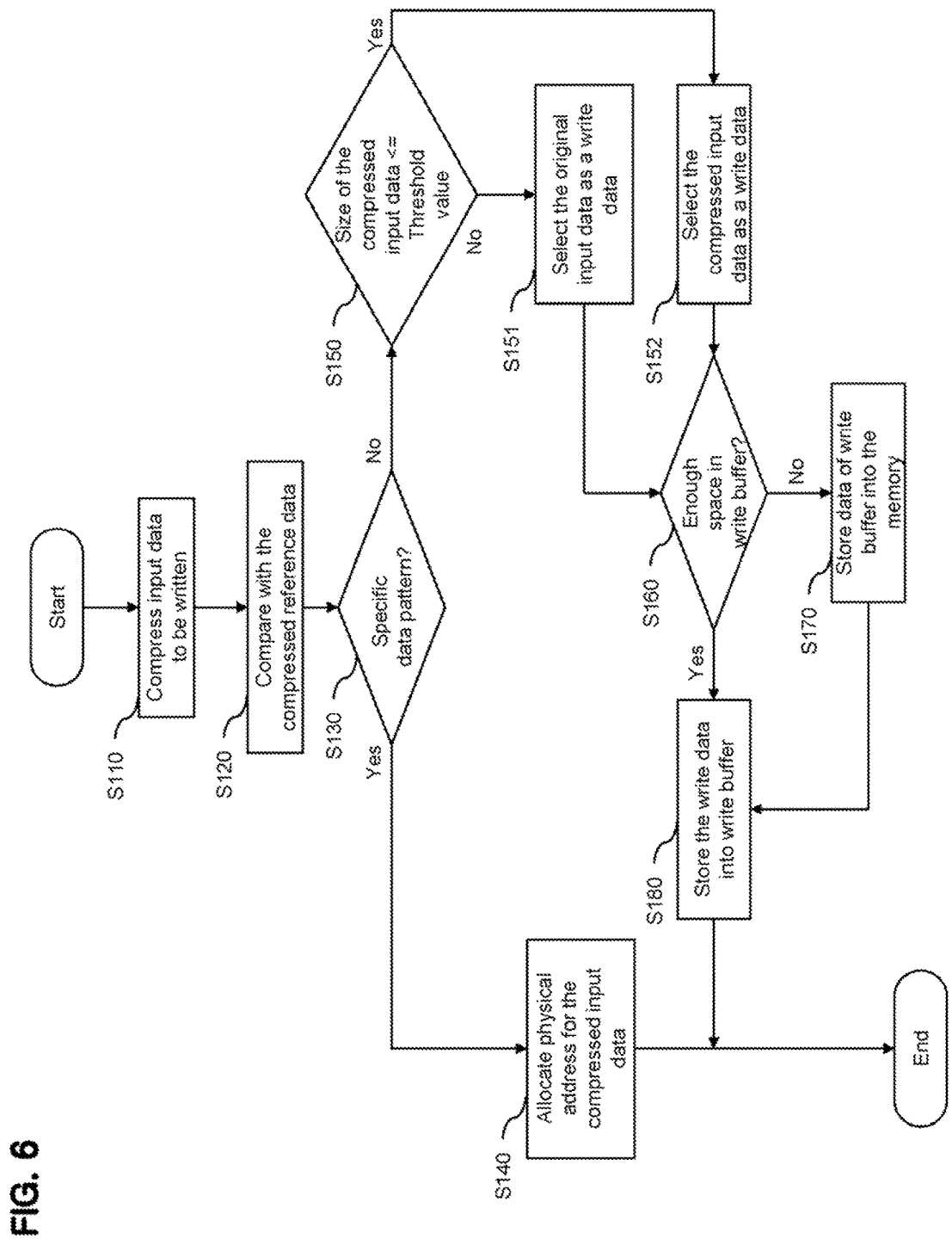
FIG. 6 is a flowchart illustrating a write operation of a semiconductor device according to an embodiment of the present invention.

FIG. 6 is a flowchart illustrating the writing operation of the semiconductor device 1000 according to an embodiment of the present invention.

The writing operation of the semiconductor device 1000 may be generally controlled by the control unit 210.

When a writing request is provided from the host 10 as well as input data to be written in the memory cell array 300 and the logical address for the input data, the compression unit 110 of the pattern detecting device 100 may compress the input data (S110).

Next, the pattern detecting device 100 may compare the compressed input data and the compressed reference data, which is a compressed representation of the specific data pattern, as described above with reference to FIG. 1 (S120).

Then, the pattern detecting device 100 may determine whether the input data has the same pattern as the specific data pattern of the compressed reference data (S130).

When the input data has the same pattern as the specific data pattern of the compressed reference data, the pattern detecting device 100 may allocate a physical address for the compressed input data (S140). In this case, a specific value, for example, "0", may be allocated as the physical address for the compressed input data. Furthermore, it is not necessary to store the compressed input data in the physical page 310.

When the input data does not have the same pattern as the specific data pattern of the compressed reference data, the pattern detecting device 100 may determine whether the size of the compressed input data is smaller than a threshold value (S150). For example, the pattern detecting device 100 may determine whether the size of the compressed input data is less than 95% of the size before compression.

When the size of the compressed input data is larger than the threshold value, the pattern detecting device 100 may select the original input data as the data to be written in the memory cell array 300 (S151), and when the size of the compressed input data is not larger than the threshold, the pattern detecting device 100 may select the compressed input data as the data to be written in the memory cell array 300 (S152).

Then, the pattern detecting device 100 may determine whether there is space for the data to be written in the write buffer 240 (S160). For example, when the original input data is selected as the data to be written, the pattern detecting device 100 may determine whether there is space for the original input data in the first write buffer 241, and when the compressed input data is selected as the data to be written, the pattern detecting device 100 may determine whether there is a space for the compressed input data in the second write buffer 242.

When there is no spare space in the write buffer 240, the pattern detecting device 100 may move data stored in the write buffer 240 to the memory cell array 300 (S170), and may store the data to be written into the write buffer 240 (S180).

When there is space for data to be written in the write buffer 240, the pattern detecting device 100 may store the data to be written into the write buffer 240 (S180).

When the data to be written is the original input data, the pattern detecting device 100 may store the data to be written into the first write buffer 241, and when the data to be written is compressed input data, the pattern detecting device 100 may store the data to be written in the second write buffer 242.

Figure 7:
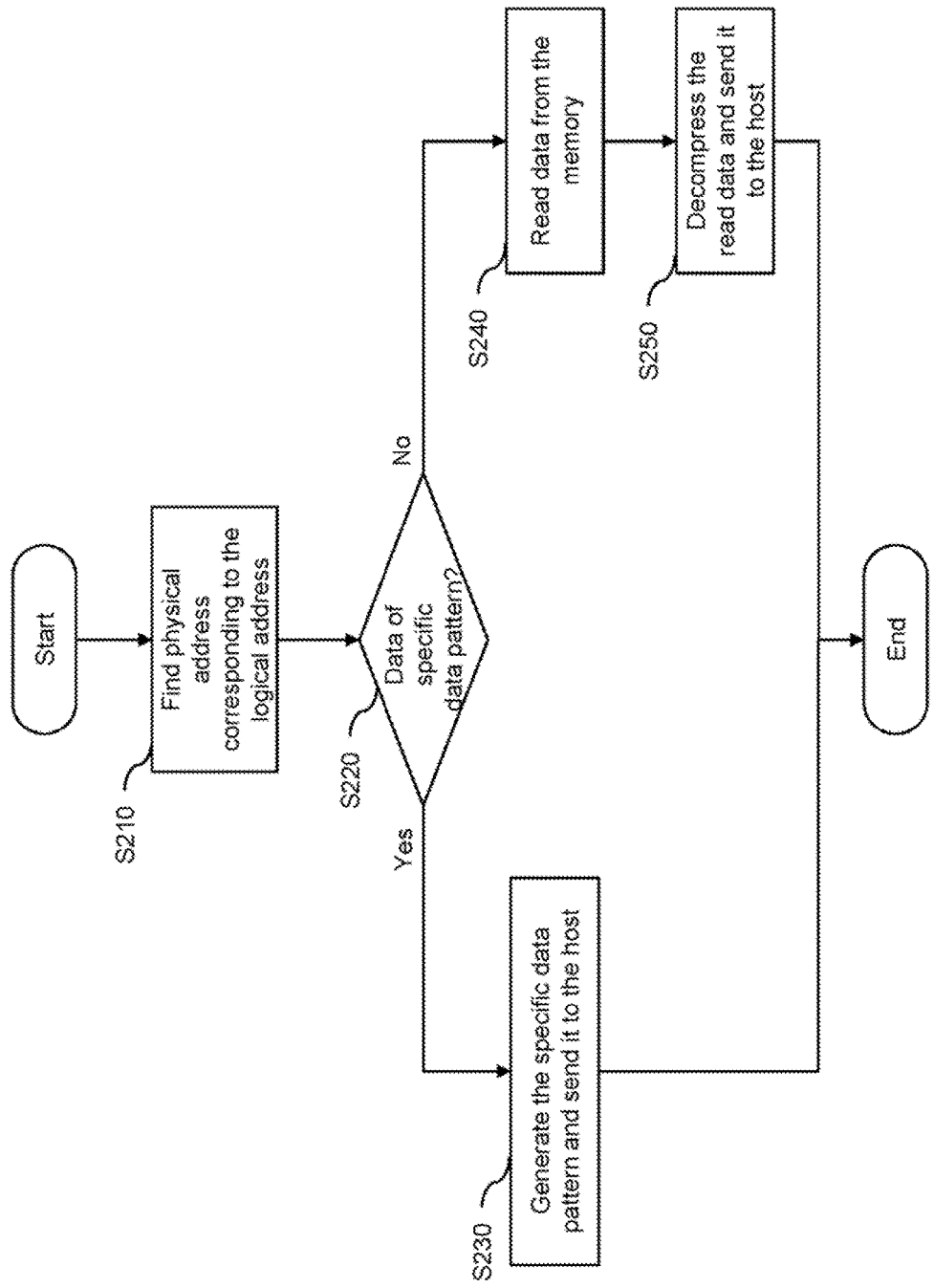
FIG. 7 is a flowchart illustrating a read operation of a semiconductor device according to an embodiment of the present invention.

FIG. 7 is a flowchart illustrating a reading operation of the semiconductor device 1000 according to an embodiment of the present invention.

The reading operation of the semiconductor device 1000 may be generally controlled by the control unit 210.

When a reading request is provided from the host 10 as well as the logical address for the stored data to be read from the memory cell array 300, the control unit 210 may find the physical address corresponding to the requested logical address by referring to the address mapping table 220 (S210).

Next, the control unit 210 may determine whether or not the data to be read has the specific data pattern based on the physical address. The compressed reference data representing the specific data pattern may be stored in the memory cell array 300 with a specific physical address, namely the physical address having the specific value "0" as described above.

When the requested data has the specific data pattern, the control unit 210 generates the specific data pattern instead of reading data from the memory cell array 300, and may transfer the generated specific data pattern to the host 10 (230) in response to the read request.

When the requested data does not have the specific data pattern, the control unit 210 may read the requested data, which may be compressed or non-compressed, from the physical page 310 of the memory cell array 300 based on the physical address corresponding to the requested logical address (S240).

The read data may be temporarily stored in the read buffer 250.

Then, the control unit 210 may decompress the read data, and may transfer the decompressed data to the host (S250) in response to the read request.

Figure 8:
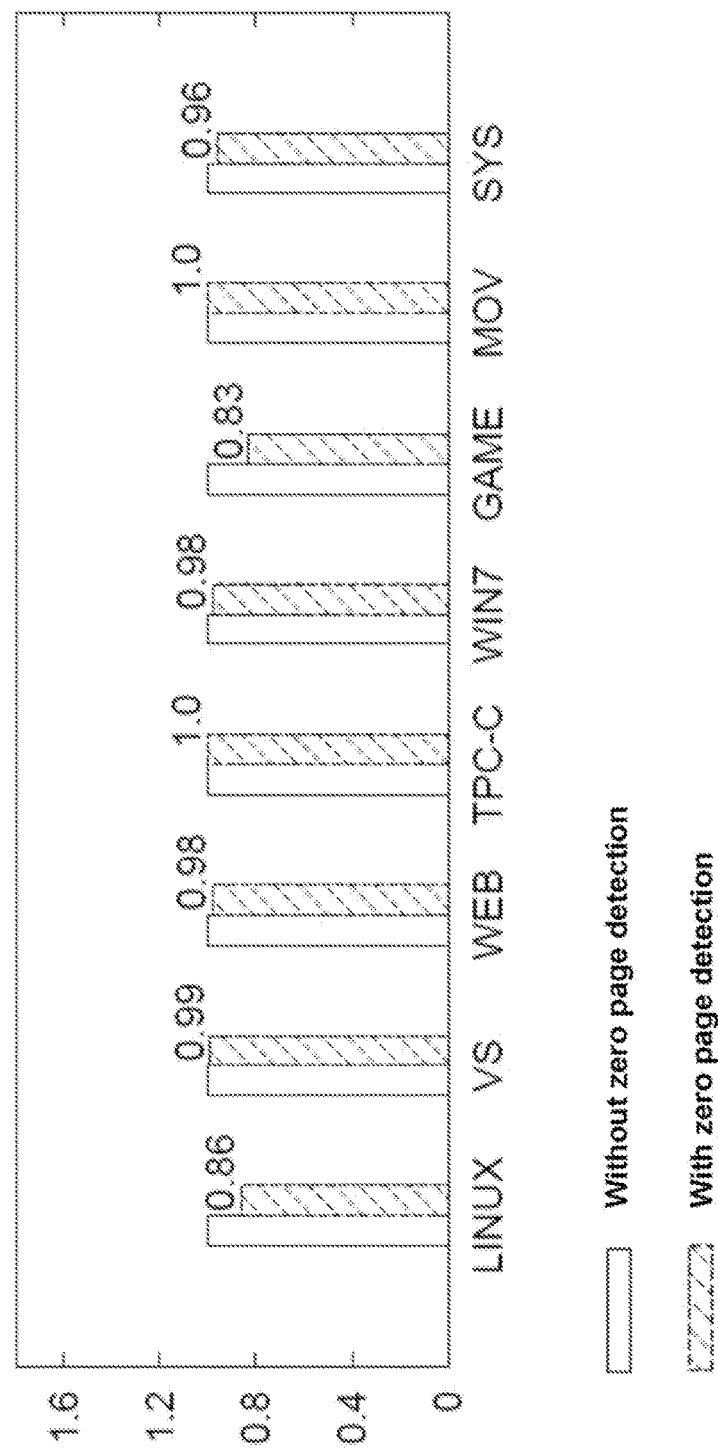
FIG. 8 and FIG. 9 are graphs illustrating the effects of the present invention.

FIG. 8 is a graph illustrating the effects of the present invention.

In the graph of FIG. 8, the performance when specific data pattern detection is applied is compared to the performance without pattern detection in a NAND flash memory device employing a scheme of compressing and storing page data.

In the graph, the horizontal axis denotes the type of benchmark and the vertical axis denotes the write amplification factor (WAF). The write amplification factor indicates the ratio of data that has been actually written in the memory cell array 300 by the control unit 210 with respect to the size of data requested to be written by the host 10.

As illustrated in FIG. 8, when the specific data pattern detecting operation is performed, since the specific data pattern is not stored, the write amplification factor is further reduced. For example, in the case of a Linux benchmark, when the specific data pattern detecting operation is performed, the write amplification factor is reduced by about 14%, compared with the case in which the zero page detecting operation is not performed.

Figure 9:
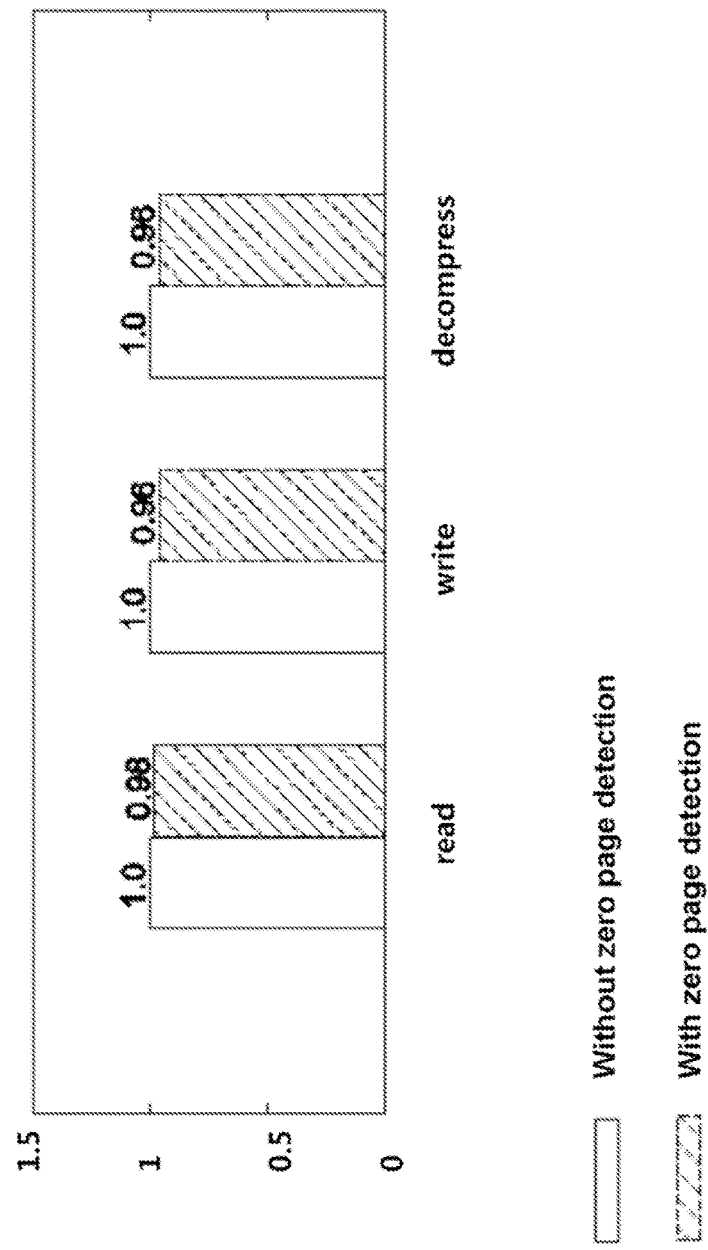

FIG. 9 is another graph Illustrating the effects of the present invention.

In the graph of FIG. 9, the number of read, write, and compress release operations when detecting the specific data pattern is compared with the number of read, write, and compress releases without pattern detection in the NAND flash memory device employing a scheme of compressing and storing page data.

Since the reading of the specific data pattern is not generated directly after writing is generated, actual user workload of about 12 hours after the installation of Window 7 has been extracted in order to measure actual performance. Through the extracted workload, the number read, write, and compress release operations have been measured with and without specific data pattern detection.

As illustrated in FIG. 9, when detecting specific data patterns, the number read operations is reduced by about 2% and the number of write and compress releases is reduced by about 4%, compared to when specific data pattern detection is not employed.

In the reading operation, when detecting the specific data pattern, the data of the specific data pattern is generated and outputted instead of actually reading data. In the writing operation, when detecting the specific data pattern, since data is not actually written, such results are obtained.

When reading and writing data in which the specific data pattern occupies a large part, as compared with data used in experiments, the reduction of required storage space is expected to be higher.

While certain embodiments have been described above, it will be understood to those skilled in the art that the embodiments described are examples only. Accordingly, the data pattern detecting device, the semiconductor device including the same, and the operating method thereof described herein should not be limited based on the described embodiments. Rather, the data pattern detecting device, the semiconductor device including the same, and the operating method thereof described herein should only be limited in light of the claims that follow when taken in conjunction with the above description and accompanying drawings.

What is claimed is:

1. A pattern detecting device comprising:
a length comparison unit configured to compare lengths of compressed input data and compressed reference data;
a data comparison unit configured to compare contents of the compressed input data and the compressed reference data; and
a flag generation unit configured to generate a detection flag by logically combining outputs of the length comparison unit and the data comparison unit,
wherein the length comparison unit controls the data comparison unit to compare contents of the compressed input data and the compressed reference data when the lengths of the compressed input data and the compressed reference data are the same,
wherein the compressed input data is obtained by compressing input data and the compressed reference data is obtained by compressing a specific data pattern,
wherein the flag generation unit controls the detection flag to have a logic value representing that the input data is different from the specific data pattern when the lengths of the compressed input data and the compressed reference data are not same regardless of an output from the data comparison unit.

2. The pattern detecting device according to claim 1, further comprising a compression unit configured to compress and output input data as the compressed input data.

3. The pattern detecting device according to claim 1, further comprising a storage unit configured to store the compressed reference data.

4. A semiconductor device comprising:
a memory cell array; and
a control device configured to control the memory cell array for input and output of data requested from a host,
wherein the control device comprises:
a pattern detecting device configured to determine whether the data requested from the host has a specific data pattern;
an address mapping table configured to store a logical address and a physical address corresponding to the logical address for the data of the memory cell array; and
a control unit configured to allocate a specific physical address for the data, which is to be written into the memory cell array in response to a request from the host and has the specific data pattern,
wherein the pattern detecting device comprises:
a length comparison unit configured to compare lengths of compressed input data and compressed reference data;

a data comparison unit configured to compare contents of the compressed input data and the compressed reference data; and a flag generation unit configured to generate a detection flag by logically combining outputs of the length comparison unit and the data comparison unit, wherein the compressed input data is obtained by compressing the data requested from the host, wherein the compressed reference data is obtained by compressing the specific data pattern, wherein the length comparison unit controls the data comparison unit to compare contents of the compressed input data and the compressed reference data when the lengths of the compressed input data and the compressed reference data are the same, and wherein the flag generation unit controls the detection flag to have a logic value representing that the data requested from the host is different from the specific data pattern when the lengths of the compressed input data and the compressed reference data are not same regardless of an output from the data comparison unit.

5. The semiconductor device according to claim 4, further comprising a compression unit configured to compress and output input data as the compressed input data.

6. The semiconductor device according to claim 4, further comprising a storage unit configured to store the compressed reference data.

7. The semiconductor device according to claim 4, wherein the control unit stores the compressed input data in the memory cell array when the data requested from the host does not have the specific data pattern.

8. The semiconductor device according to claim 7, wherein the control device further comprises a write buffer configured to temporarily store the compressed input data.

9. The semiconductor device according to claim 8, wherein the control unit moves data in the write buffer into the memory cell array, and stores the compressed input data in the write buffer.

10. The semiconductor device according to claim 7, wherein the control device further comprises a decompression unit configured to decompress data read from the memory cell array.

11. The semiconductor device according to claim 10, wherein the control device further comprises a read buffer configured to temporarily store the data read from the memory cell array.

* * * * *